(12) United States Patent
Kaida

(10) Patent No.: US 6,717,334 B2
(45) Date of Patent: Apr. 6, 2004

(54) ELECTRONIC COMPONENT AND METHOD FOR FORMING SUBSTRATE ELECTRODE OF THE SAME

(75) Inventor: Hiroaki Kaida, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 19 days.

(21) Appl. No.: 10/109,135

(22) Filed: Mar. 28, 2002

(65) Prior Publication Data

US 2002/0160540 A1 Oct. 31, 2002

(30) Foreign Application Priority Data

Apr. 25, 2001 (JP) .......................................... 2001-127945

(51) Int. Cl.⁷ ............................................. H01L 41/053
(52) U.S. Cl. ...................................... 310/348; 310/365
(58) Field of Search ................................ 310/320, 348, 310/352, 365, 366

(56) References Cited

U.S. PATENT DOCUMENTS

| | | | |
|---|---|---|---|
| 5,217,922 A | * | 6/1993 | Akasaki et al. ............. 438/125 |
| 5,406,682 A | * | 4/1995 | Zimnicki et al. ........... 29/25.35 |
| 5,604,667 A | * | 2/1997 | Morimoto .................... 361/760 |
| 6,140,743 A | * | 10/2000 | Kishima et al. ............. 310/330 |
| 6,369,487 B1 | * | 4/2002 | Kameda et al. ............. 310/320 |

FOREIGN PATENT DOCUMENTS

| | | | | |
|---|---|---|---|---|
| JP | 64-7638 | * | 1/1989 | ........... H01L/21/92 |
| JP | 11-26628 | | 1/1999 | ........... H01L/23/12 |

* cited by examiner

*Primary Examiner*—Thomas M. Dougherty
(74) *Attorney, Agent, or Firm*—Keating & Bennett, LLP

(57) ABSTRACT

An electronic component includes a case substrate. Substrate electrodes having a substantially spherical outer surface are disposed on at least a first principal surface of the case substrate. A piezoelectric resonator is mounted on the case substrate such that the piezoelectric resonator is bonded to the outer surfaces of the substrate electrodes by a conductive bonding material and is supported by the substrate electrodes in a point-contact manner. Also, the formula, Lk−2We<Lp<Lk−We, is satisfied where Lp is the length of the piezoelectric resonator, Lk is the length of the case substrate, and We is the length of the substrate electrode.

14 Claims, 5 Drawing Sheets

ELECTRONIC COMPONENT AND METHOD FOR FORMING SUBSTRATE ELECTRODE OF THE SAME

BACKGROUND OF THE INVENTION

1. Field of the Invention

The present invention relates to an electronic component having an electronic component element which is mounted on a case substrate with a space therebetween and a manufacturing method for such an electronic component. More specifically, the present invention relates to an electronic component in which a bonding configuration of a substrate electrode on the case substrate and the electronic component element is improved and also relates to a method for manufacturing such an electronic component.

2. Description of the Related Art

Various electronic components, in which an electronic component element is mounted on a case substrate, have been proposed. For example, Japanese Unexamined Patent Application Publication No. 11-26628 discloses a package configuration for an electronic component shown in FIG. 7.

As seen in FIG. 7, in the electronic component 101, an energy-trap-type piezoelectric resonator 103 is mounted on a case substrate 102. Also, a cap 104 is fixed to the case substrate 102 so as to cover the energy-trap-type piezoelectric resonator 103.

The center portion in the longitudinal direction of the piezoelectric resonator 103 functions as a resonant portion, and resonance energy is confined in the resonant portion. The piezoelectric resonator 103 is fixed to the case substrate 102 with a space A therebetween so that the vibration in the resonant portion is not disturbed. In order to provide the space A, via-hole electrodes 105 and 106 are provided in the case substrate 102 such that they protrude upward beyond the upper surface 102a of the case substrate 102. The piezoelectric resonator 103 is bonded to the upper ends of the via-hole electrodes 105 and 106 by a conductive adhesive 108a and 108b.

In the piezoelectric resonator disclosed in Japanese Unexamined Patent Application Publication No. 11-26628, vibration energy is almost entirely confined to the resonant portion. However, the vibration energy is not completely confined and leaked vibration travels to both ends in the longitudinal direction of the piezoelectric resonator 103. Accordingly, when the piezoelectric resonator 103 is bonded to and supported by the via-hole electrodes 105 and 106, the resonance characteristic may be degraded by the supporting configuration.

In particular, as the piezoelectric resonator 103 is miniaturized, the distance between the resonant portion and the end in the longitudinal direction of the piezoelectric resonator 103, that is, the length of a vibration dumping portion is decreased. Thus, degradation in the resonance characteristic due to the above-described supporting configuration becomes a big problem in miniaturization of the piezoelectric resonator.

Also, in the electronic component 101, the cap 104 must be provided in a precise position so that the cap 104 does not come into contact with the piezoelectric resonator 103. If the cap 104 is deviates from the precise proper position, the cap 104 may contact the piezoelectric resonator 103. Also, when the electronic component 101 is conveyed by sucking the upper surface of the cap 104 using a vacuum chuck, the electronic component 101 may not be held by the vacuum chuck if the cap 104 is positioned with only a slight deviation.

Incidentally, the diameter of the top of the above-described via-hole electrodes 105 and 106 is relatively small, and thus, adverse effects of the supporting configuration of the piezoelectric resonator 103 given to the resonance characteristic can be reduced, compared to the case where the piezoelectric resonator 103 is bonded to planar substrate electrodes. However, since the diameter of the via-hole electrodes 105 and 106 is small, positioning of the piezoelectric resonator 103 and the via-hole electrodes 105 and 106 must be performed with high accuracy.

That is, when the piezoelectric resonator 103 is mounted on the case substrate 102, positioning of the piezoelectric resonator 103 must be performed with high accuracy. Accordingly, the manufacturing process is complicated and an expensive positioning mechanism is needed.

The foregoing are also substantial problems in general electronic components, such as heater elements, which are required to be fixed to a case substrate with a predetermined space therebetween, as well as the energy-trap-type piezoelectric resonator.

SUMMARY OF THE INVENTION

In order to overcome the problems described above, preferred embodiments of the present invention provide an electronic component in which an electronic component element is mounted on a case substrate with a space therebetween, and degradation in the resonance characteristic due to the bonding configuration between a case substrate and an electronic component element is minimized, and in which the electronic component element is easily positioned and fixed to the case substrate, and a method for manufacturing the same.

In addition, preferred embodiments of the present invention provide an electronic component in which a cap can be easily positioned to a case substrate and mounted thereon and a method for manufacturing the same, in the above-described electronic component and the method for manufacturing the same.

An electronic component according to a preferred embodiment of the present invention includes a case substrate having first and second principal surfaces facing each other, a plurality of substrate electrodes disposed on at least the first principal surface, each substrate electrode having a substantially spherical outer surface, an electronic component element, which is mounted on the first principal surface with a space therebetween and which is supported by the plurality of substrate electrodes in a point-contact manner, and a conductive bonding material for bonding the electronic component element to the plurality of substrate electrodes.

Preferably, the electronic component element includes a substantially rectangular plate and is supported at both ends thereof in the longitudinal direction by the plurality of substrate electrodes in a point-contact manner, and the following formula is satisfied:

$$Lk - 2We < Lp < Lk - We$$

where $Lp$ is the length of the electronic component element in the longitudinal direction of the electronic component element, $Lk$ is the length of the case substrate in the longitudinal direction of the electronic component element, and $We$ is the length of the substrate electrode in the longitudinal direction of the electronic component element.

The electronic component may further comprise a cap having an opening in a lower portion, an opening edge thereof being fixed to the case substrate so as to cover the electronic component element.

Preferably, the cap has an insulative surface, the opening edge of the cap is in contact with the outer surfaces of the plurality of substrate electrodes, and the following formula is satisfied:

$$Lk-We<Lc$$

where Lc is the length of the cap in the longitudinal direction of the electronic component element.

In the electronic component according to preferred embodiments of the present invention, each of the substrate electrodes preferably includes an electrode layer formed by applying and baking a conductive paste, so that the outer surface of each substrate electrode is reliably substantially spherical shaped.

Preferably, the conductive bonding material is a flexible conductive adhesive, and thus degradation in the characteristic of the electronic component element due to the supporting configuration of the electronic component by the case substrate does not occur.

In the electronic component according to preferred embodiments of the present invention, although the electronic component element is not limited, an energy-trap-type piezoelectric resonator may be used.

A method for manufacturing an electronic component according to another preferred embodiment of the present invention includes steps of preparing a case substrate having first and second principal surfaces facing each other and a transfer plate made of a flexible material and having a plurality of grooves which extend in one direction and which are filled with a conductive paste, applying the conductive paste to at least the first principal surface by pressing the first principal surface into contact with one surface of the transfer plate and then removing the transfer plate, forming a plurality of substrate electrodes, each having a substantially spherical outer surface, on the first principal surface of the case substrate by baking the conductive paste, mounting an electronic component element on the case substrate provided with the substrate electrodes such that the electronic component element is spaced from the first principal surface and is supported by the plurality of substrate electrodes in a point-contact manner, and bonding the substrate electrodes of the case substrate to the electronic component element using a conductive bonding material.

Other features, elements, characteristics and advantages of the present invention will become more apparent from the following detailed description of preferred embodiments with reference to the attached drawings.

DETAILED DESCRIPTION OF PREFERRED EMBODIMENTS

Hereinafter, the present invention will be clearly specified by describing specific preferred embodiments with reference to the accompanying drawings.

Figure 1A:
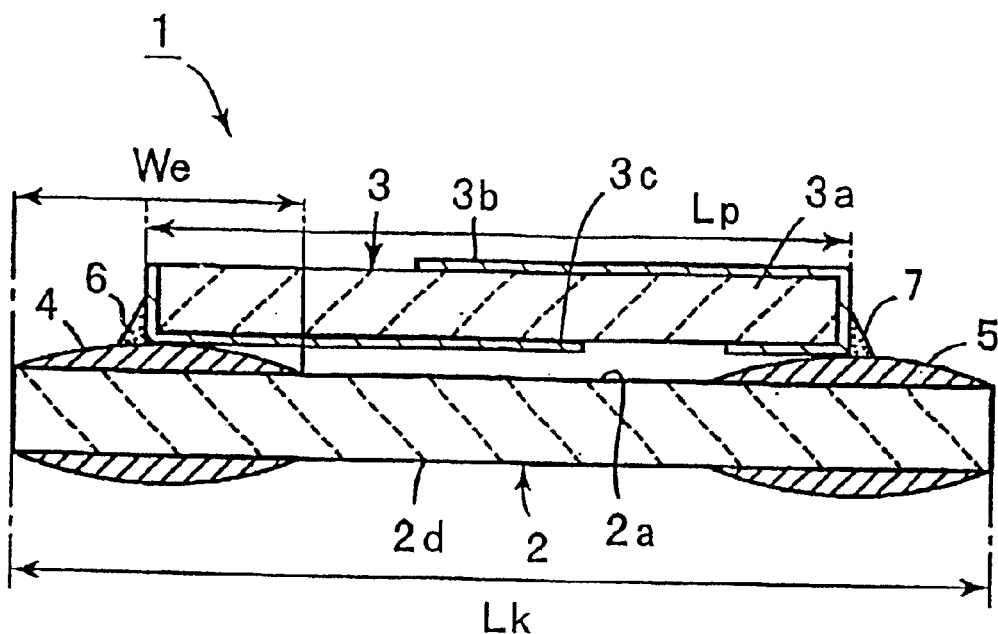
FIG. 1A is a longitudinal sectional view of an electronic component according to a first preferred embodiment of the present invention.
Figure 1B:
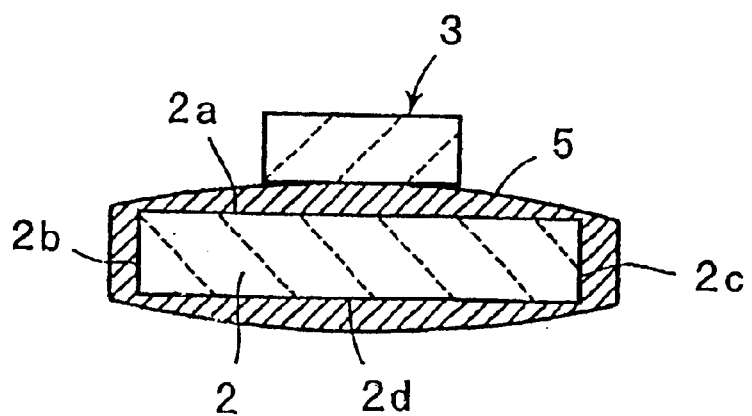
FIG. 1B is a cross sectional view of the electronic component of FIG. 1A.

FIG. 1A is a longitudinal sectional view of an electronic component according to a first preferred embodiment of the present invention and FIG. 1B is a cross sectional view of the same.

The electronic component 1 according to the first preferred embodiment includes a case substrate 2 and an energy-trap-type piezoelectric resonator 3 mounted on the case substrate 2.

The piezoelectric resonator 3, which is schematically illustrated in FIGS. 1A and 1B, is preferably an energy-trap-type piezoelectric resonator using a thickness shear mode. The piezoelectric resonator 3 includes a substantially rectangular piezoelectric plate 3a and resonance electrodes 3b and 3c disposed on the upper surface and the lower surface of the piezoelectric plate 3a. The resonance electrodes 3b and 3c overlap each other at the center portion in the longitudinal direction of the piezoelectric plate 3a, with the piezoelectric plate 3a therebetween. This overlapped portion of the resonance electrodes 3b and 3c defines a resonant portion to which vibration energy is confined.

The case substrate 2 is substantially rectangular and plate-like and is made of an insulative material. As the insulative material for the case substrate 2, an insulative ceramic such as alumina is preferably used in this preferred embodiment.

Substrate electrodes 4 and 5 are disposed on the upper surface (one principal surface) 2a at the both ends in the longitudinal direction of the case substrate 2. These substrate electrodes 4 and 5 cover a pair of side surfaces 2b and 2c and the lower surface 2d as well as the upper surface 2a of the case substrate 2, as shown in FIG. 1B in which the substrate electrode 5 is representatively shown. Each of the substrate electrodes 4 and 5 has a substantially spherical outer surface in the upper surface 2a of the case substrate 2. That is, its cross section is arc-shaped. Also, in the lower surface 2d, each of the substrate electrodes 4 and 5 has a substantially spherical outer surface.

Figure 2:
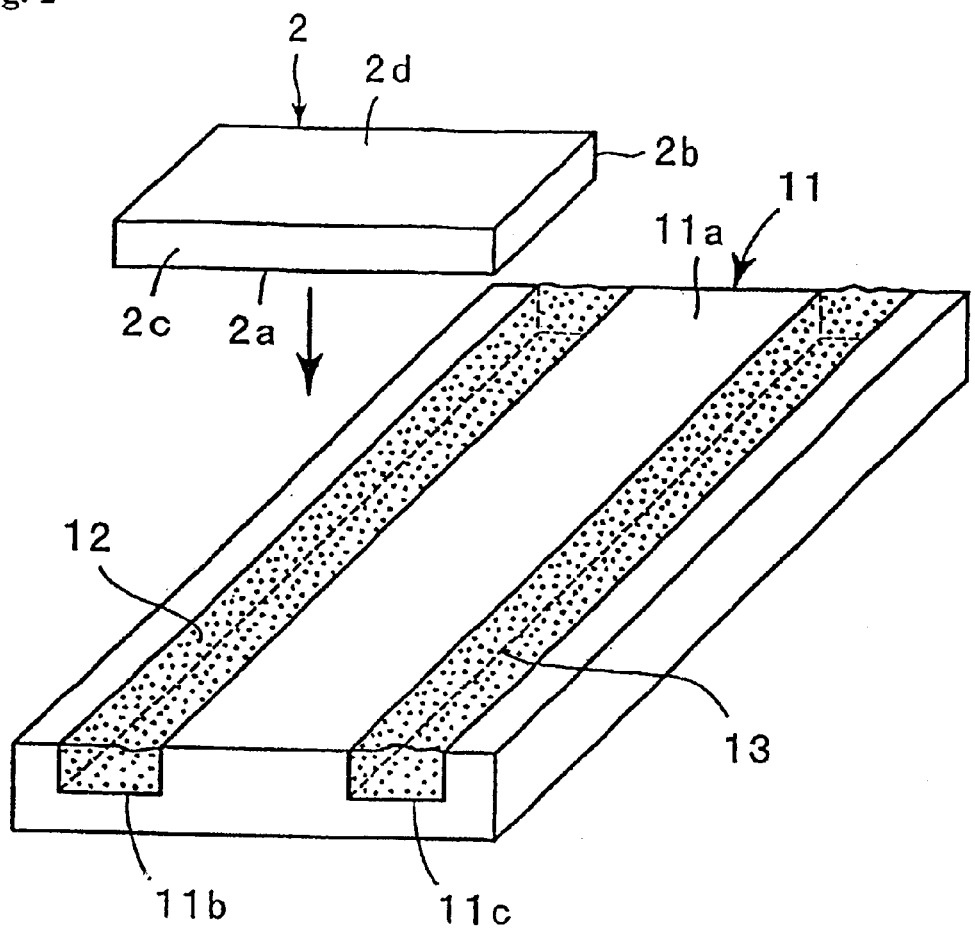
FIG. 2 is a perspective view for illustrating a process of applying a conductive paste to a case substrate by a transfer method in the first preferred embodiment of the present invention.

In order to form the substrate electrodes 4 and 5, each having a substantially spherical outer surface, a transfer plate 11 shown in FIG. 2 is used. The transfer plate 11 is made of a flexible material such as rubber. On the upper surface 11a of the transfer plate 11, two grooves 11b and 11c are formed as concave portions. The grooves 11b and 11c are filled with a conductive paste 12 and 13, respectively.

Figure 3:
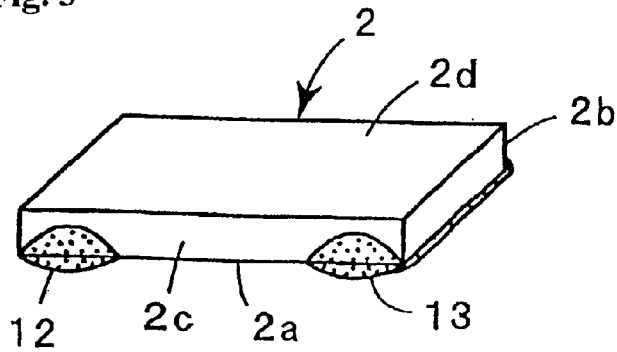
FIG. 3 is a perspective view illustrating a state where the conductive paste is transferred to the case substrate.

Then, the upper surface 2a of the case substrate 2 is pressed into contact with the upper surface 11a of the transfer plate 11 and then the case substrate 2 is removed from the upper surface 11a of the transfer plate 11 after a predetermined period of time. In this way, the conductive paste 12 and 13 is applied to the upper surface 2a and the pair of side surfaces 2b and 2c of the case substrate 2 as shown in FIG. 3.

Next, the case substrate 2 is turned upside-down and the transfer process is performed again using the transfer plate 11. In this way, the conductive paste is applied to the case substrate 2. After a predetermined period of time, the conductive paste is baked so that the substrate electrodes 4 and 5 shown in FIGS. 1A and 1B are formed.

Incidentally, methods other than the above-described application and baking of a conductive paste can be used in order to form the substrate electrodes 4 and 5 having a substantially spherical outer surface. In the application and baking of a conductive paste, since the conductive paste is in paste form before baking, the substrate electrodes 4 and 5 having a substantially spherical outer surface can be easily formed by adjusting the viscosity of the conductive paste and using surface tension thereof.

Referring back to FIGS. 1A and 1B, the piezoelectric resonator 3 is mounted on the case substrate 2. In this case, the piezoelectric resonator 3 is supported in a point-contact manner by the substrate electrodes 4 and 5 having a substantially spherical outer surface at both ends in the longitudinal direction of the piezoelectric resonator 3. That is, as shown in FIGS. 1A and 1B, each of the substrate electrodes 4 and 5 having a substantially spherical outer surface has an arc-shaped cross section. Thus, the piezoelectric resonator 3 is supported in a point-contact manner by the substrate electrodes 4 and 5 at both ends of the piezoelectric resonator 3.

The substrate electrodes 4 and 5 are electrically connected to the piezoelectric resonator 3 by a conductive adhesive 6 and 7. The conductive adhesive 6 and 7 is flexible and thus does not disturb the vibration of the piezoelectric resonator 3. More specifically, the resonance electrode 3c of the piezoelectric resonator 3 is electrically connected to the substrate electrode 4 by the conductive adhesive 6. On the other hand, the resonance electrode 3b is formed from the upper surface via a side surface to the lower surface of the piezoelectric plate 3a. The resonance electrode 3b is electrically connected to the substrate electrode 5 by the conductive adhesive 7 at the portion including the side surface and the lower surface of the piezoelectric resonator 3.

In the electronic component 1 of the present preferred embodiment, the piezoelectric resonator 3 is bonded to the substrate electrodes 4 and 5 in a point-contact manner and electrical connection is achieved by the flexible conductive adhesive 6 and 7. Such a support configuration for the piezoelectric resonator 3 assists in avoiding vibration suppression, even when the vibration leaked from the resonant portion travels to the end of the piezoelectric plate 3a. Therefore, the piezoelectric resonator 3 can be supported by the case substrate 2 without varying the resonance characteristic of the piezoelectric resonator 3.

Further, in the electronic component 1, the following formula (1) is preferably satisfied where the length of the piezoelectric resonator 3 as the electronic component element in the longitudinal direction thereof is Lp, the length of the case substrate 2 in the longitudinal direction of the piezoelectric resonator 3 is Lk, and the length of each of the substrate electrodes 4 and 5 in the longitudinal direction of the piezoelectric resonator 3 is We.

$$Lk-2We<Lp<Lk-We \qquad (1)$$

The electronic component 1 is constructed so that the above formula (1) is satisfied. When the piezoelectric resonator 3 is mounted on the case substrate 2, both ends in the longitudinal direction of the piezoelectric resonator 3 are brought into contact with the substrate electrodes 4 and 5 at the inside of the center in the longitudinal direction of the substrate electrodes 4 and 5. Accordingly, both ends of the piezoelectric resonator 3 are reliably in contact with the substrate electrodes 4 and 5 in a point-contact manner.

In cases where $Lp \geq Lk-We$, and the top of each of the substrate electrodes 4 and 5 is at its center, both ends of the piezoelectric resonator 3 may be positioned outside the top of the substrate electrodes 4 and 5.

When the substrate electrodes 4 and 5 having a substantially spherical outer surface are formed according to the above-described manufacturing method of application and baking of the conductive paste, the top area of each of the substrate electrodes 4 and 5 on the case substrate 2 is likely to be planarized slightly from a substantially spherical shape due to the weight of the conductive paste. Therefore, when both ends of the piezoelectric resonator 3 extend outside the tops of the substrate electrodes 4 and 5, the piezoelectric resonator 3 may be possibly come into contact with the substrate electrodes 4 and 5 in a face-contact manner.

On the other hand, when the above formula (1) is satisfied in the electronic component 1, the piezoelectric resonator 3 is in contact with the substrate electrodes 4 and 5 at the inclined surfaces inside the tops thereof. In this case, the piezoelectric resonator 3 may be reliably supported by the substrate electrodes 4 and 5 in a point-contact manner.

Incidentally, in case where $Lp \leq Lk-2We$, both ends of the piezoelectric resonator 3 cannot be in contact with the substrate electrodes 4 and 5.

Figure 4A:
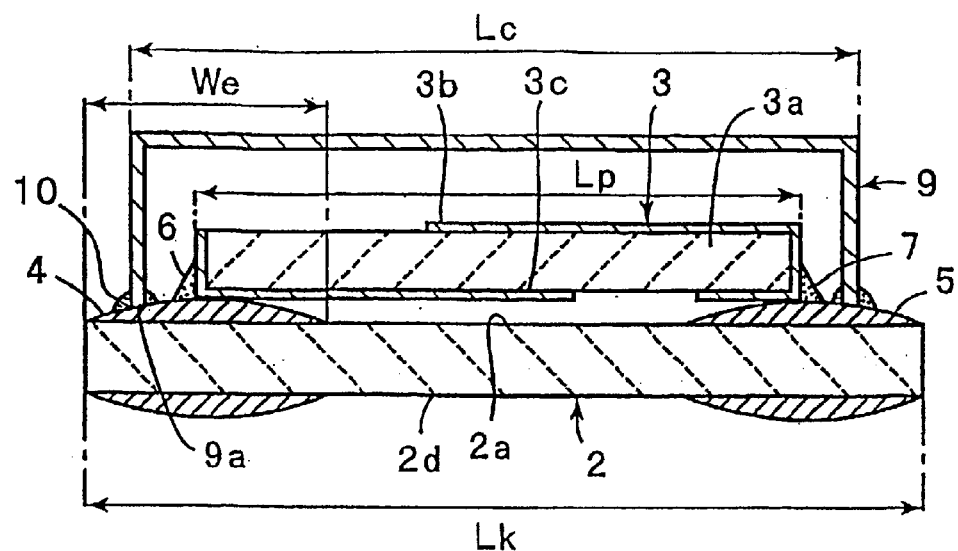
FIG. 4A is a longitudinal sectional view of an electronic component according to a second preferred embodiment of the present invention.
Figure 4B:
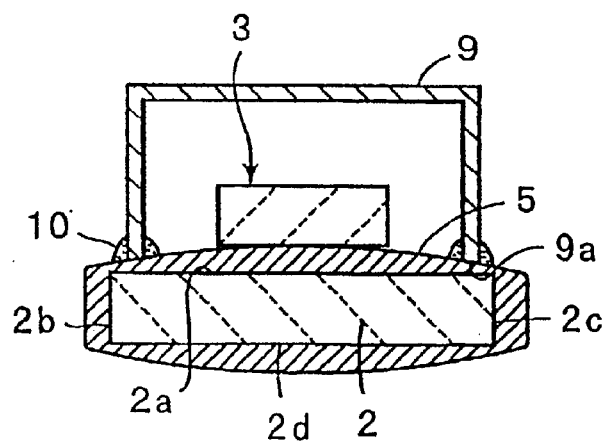
FIG. 4B is a cross sectional view of the electronic component shown in FIG. 4A.

FIG. 4A is a longitudinal sectional view of an electronic component according to a second preferred embodiment of the present invention and FIG. 4B is a cross sectional view of the same.

In the second preferred embodiment, the electronic component 1 is constructed in the same way as in the first preferred embodiment except that a cap 9 is fixed to the case substrate 2. Accordingly, like reference numerals depict like elements and the corresponding detailed descriptions will be omitted.

In the second preferred embodiment, the cap 9 is preferably made of an insulative material such as synthetic resin. Also, the cap 9 may be made of a metallic plate having an outer surface that is covered with an insulating layer. That is, the material for the cap 9 is not limited as long as the portions thereof to be bonded to the case substrate 2 are made of an insulative material.

The cap 9 has an opening in the lower portion thereof and is fixed to the upper surface 2a of the case substrate 2 at an opening edge 9a using an adhesive 10. The adhesive 10 may be any of a conductive adhesive and an insulative adhesive.

By fixing the cap 9 to the case substrate 2, the piezoelectric resonator 3 is covered by a package including the cap 9 and the case substrate 2.

In the second preferred embodiment, the cap 9 is located above the case substrate 2 such that the cap 9 is bonded to the upper surface of the substrate electrodes 4 and 5. That is, since each of the substrate electrodes 4 and 5 has a substantially spherical outer surface on the upper surface 2a of the case substrate 2, the cap 9 can be positioned in accordance with an inclined shape of the spherical outer surface of the substrate electrodes 4 and 5. Accordingly, the cap 9 can be positioned easily with high accuracy and can be fixed to the case substrate 2 on which the piezoelectric resonator 3 is mounted.

Preferably, the following formula is satisfied where the length of the cap 9 in the longitudinal direction of the piezoelectric resonator 3 is Lc.

$$Lk-We<Lc \qquad (2)$$

When the electronic component 1 is constituted such that the above formula (2) is satisfied, the opening edge 9a of the cap 9 is reliably positioned on the upper surface of the substrate electrodes 4 and 5. Accordingly, the cap 9 can be bonded to the case substrate 2 by positioning the opening edge 9a of the cap 9 in accordance with the outer surface of the substrate electrodes 4 and 5 as described above.

Figure 5:
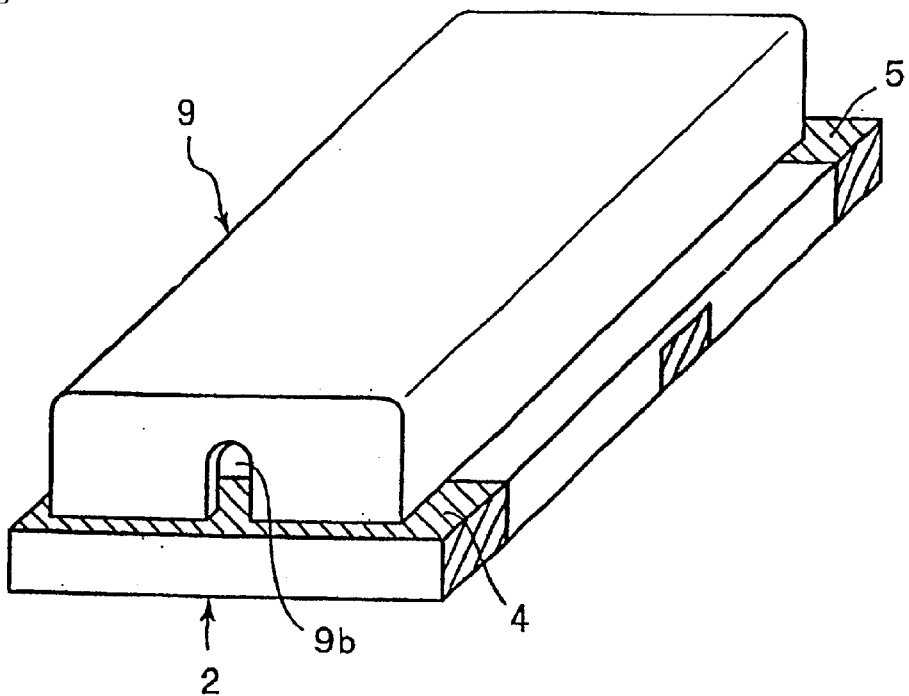
FIG. 5 is a perspective view showing a modification of the electronic component of preferred embodiments of the present invention.
Figure 6:
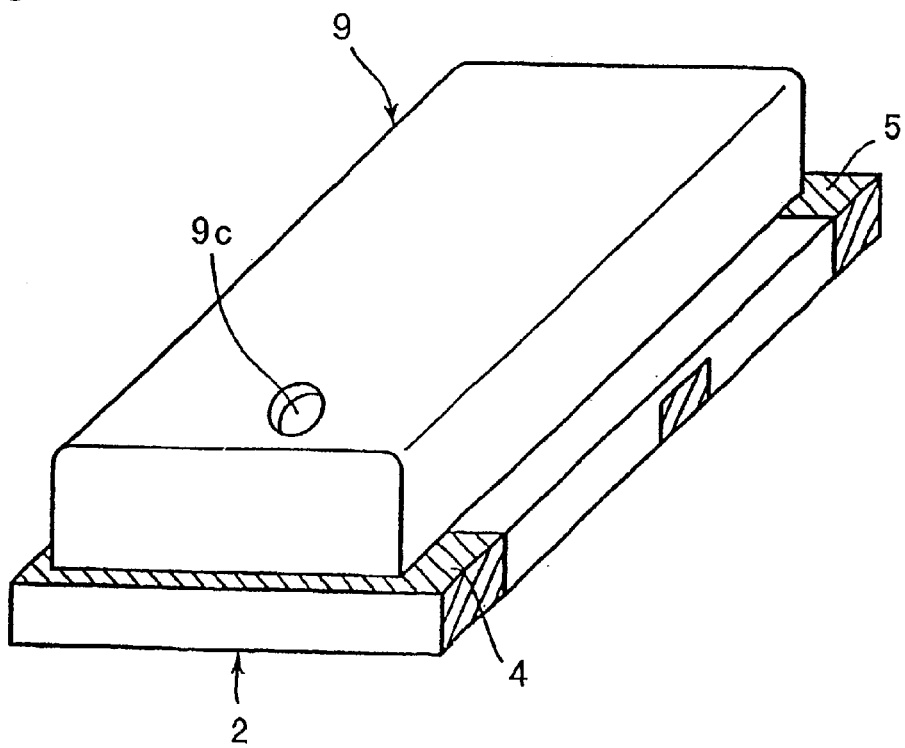
FIG. 6 is a perspective view showing another modification of the electronic component of preferred embodiments of the present invention.
Figure 7:
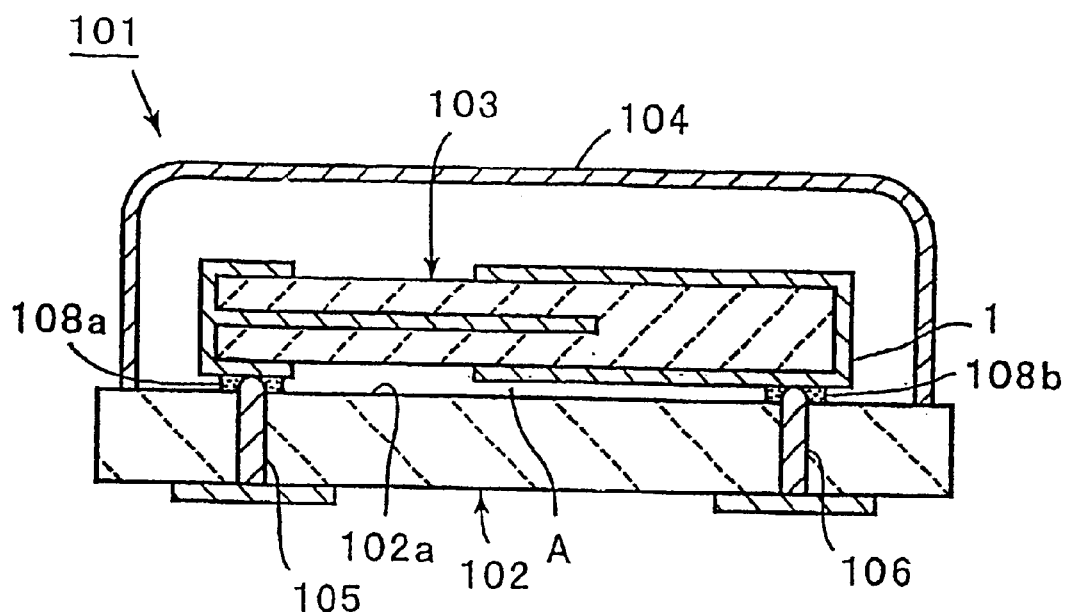
FIG. 7 is a longitudinal sectional view showing an example of a known electronic component.

Incidentally, the cap 9 may have a notch 9b at the portion for bonding to the case substrate 2 as shown in FIG. 5. Alternatively, as shown in FIG. 6, the cap 9 has a hole 9c for preventing displacement of the cap 9 due to increase in an internal pressure.

By providing the above-described notch 9b or hole 9c, the internal pressure can be kept substantially equal to the external pressure, and proper airflow can be ensured. Also, displacement of the cap 9 due to an increase in the internal pressure can be prevented and accuracy of positioning can be further improved. In FIGS. 5 and 6, the substrate electrodes 4 and 5 are schematically illustrated so that only their position can be seen.

In the above-described preferred embodiments, the energy-trap-type piezoelectric resonator 3 using a thickness shear mode is preferably used as an electronic component element. However, other vibration modes, such as a thickness longitudinal mode can be used. Also, a piezoelectric resonator other than an energy-trap-type piezoelectric resonator can be used. Also, the present invention can be applied to an electronic component using an electronic component element such as a heater element which is fixed to a case substrate with a space therebetween so as to suppress thermal conduction.

In the electronic component according to preferred embodiments of the present invention, the plurality of substrate electrodes disposed on at least the first principal surface of the case substrate have a substantially spherical outer surface and the electronic component element is supported by the substrate electrodes in a point-contact manner. With this supporting configuration of the electronic component element by the case substrate, the electronic component element is less likely to be affected, and thus variation and degradation in the characteristics of the electronic component element are prevented.

In particular, when further miniaturization of the electronic component element is performed, the distance between the substrate electrodes for supporting the electronic component element is reduced. Even in such a case, in preferred embodiments of the present invention, adverse effects on the electronic component element caused by the supporting configuration of the substrate electrodes are prevented. Accordingly, a miniaturized electronic component, in which variation and degradation in the characteristic of the electronic component element do not occur, can be reliably provided.

Also, when the electronic component is constructed to satisfy the above formula (1), where Lp is the length of the electronic component element, Lk is the length of the case substrate, and We is the length of the substrate electrode, the electronic component element can be reliably brought into contact with the inclined portions inside the tops of the substrate electrodes in a point-contact manner. Accordingly, variation and degradation in the characteristic of the electronic component element due to the supporting configuration can be reliably prevented.

When the cap is fixed to the case substrate, the electronic component in which the electronic component element is covered by the cap can be configured according to preferred embodiments of the present invention.

In particular, when the opening edge of the cap is bonded to the outer surfaces of the plurality of substrate electrodes and the formula (2) is satisfied with regard to the length Lc of the cap, the opening edge of the cap can be reliably brought into contact with the substrate electrodes and the cap can be easily positioned using the substantially spherical outer surface of the substrate electrodes.

When each of the substrate electrodes includes an electrode layer formed by applying and baking the conductive paste, the substrate electrodes having a substantially spherical outer surface can be easily formed by adjusting the viscosity of the conductive paste.

When the conductive bonding material is a flexible conductive adhesive, a constraint function to the electronic component element by the conductive bonding material can be reduced. Accordingly, variation and degradation in the characteristic of the electronic component element due to the supporting configuration are reliably prevented.

When the electronic component element is an energy-trap-type piezoelectric resonator, an energy-trap-type piezoelectric resonance component, in which variation and degradation in the resonance characteristic are prevented, can be provided according to preferred embodiments of the present invention.

In the method for manufacturing an electronic component according to preferred embodiments of the present invention, a conductive paste is applied to at least the first principal surface of the case substrate using the transfer plate having a plurality of grooves which are filled with a conductive paste. Therefore, the outer surface of the conductive paste can be formed into a substantially spherical shape using surface tension of the conductive paste and the substrate electrodes having a spherical outer surface can be reliably formed by baking. Accordingly, the present invention provides an electronic component having the case substrate provided with the substrate electrodes having a substantially spherical outer surface.

While the present invention has been described with reference to what are at present considered to be preferred embodiments, it is to be understood that various changes and modifications may be made thereto without departing from the invention in its broader aspects and therefore, it is intended that the appended claims cover all such changes and modifications that fall within the true spirit and scope of the invention.

What is claimed is:

1. The electronic component comprising:
   a case substrate having first and second principal surfaces facing each other;
   a plurality of substrate electrodes disposed on at least the first principal surface, each substrate electrode having a substantially spherical outer surface;
   an electronic component element, which is mounted on the first principal surface with a space therebetween and which is supported by the plurality of substrate electrodes in a point-contact manner;
   a conductive bonding material bonding the electronic component element to the plurality of substrate electrodes; and
   a cap having an opening extending in a downward direction, an opening edge thereof being fixed to the case substrate so as to cover the electronic component element;
   wherein the cap has an insulative surface, the opening edge of the cap is in contact with the outer surfaces of the plurality of substrate electrodes, and the following formula is satisfied:

$$Lk-We<Lc$$

where Lk is the length of the case substrate in the longitudinal direction of the electronic component element, We is the length of the substrate electrode in the longitudinal direction of the electronic component element, and Lc is the length of the cap in the longitudinal direction of the electronic component element.

2. The electronic component according to claim 1, wherein the electronic component element includes a substantially rectangular plate and is supported at both ends thereof in the longitudinal direction by the plurality of substrate electrodes in a point-contact manner, and the following formula is satisfied:

$$Lk-2We<Lp<Lk-We$$

where Lp is the length of the electronic component element in the longitudinal direction thereof.

3. The electronic component according to claim 1, wherein the electronic component element is an energy-trap-type piezoelectric resonator.

4. The electronic component according to claim 1, wherein each of the substrate electrodes has a cross section that is arc-shaped.

5. The electronic component according to claim 1, wherein each of the substrate electrodes includes an electrode layer made of a baked conductive paste.

6. The electronic component according to claim 1, wherein the conductive bonding material is a flexible conductive adhesive.

7. The electronic component comprising:
   a case substrate having first and second principal surfaces facing each other;
   a plurality of substrate electrodes disposed on at least the first principal surface, each substrate electrode having a substantially spherical outer surface;
   an electronic component element, which is mounted on the first principal surface with a space therebetween and which is supported by the plurality of substrate electrodes in a point-contact manner; and
   a conductive bonding material bonding the electronic component element to the plurality of substrate electrodes;
   wherein the substrate electrodes are disposed on an upper surface of the case substrate, and cover a pair of side surfaces and a lower surface of the case substrate.

8. The electronic component according to claim 7, further comprising a cap having an opening extending in a downward direction, an opening edge thereof being fixed to the case substrate so as to cover the electronic component element.

9. The electronic component according to claim 7, wherein each of the substrate electrodes has a substantially spherical outer surface at each of the upper surface and the lower surface of the case substrate.

10. The electronic component according to claim 7, wherein each of the substrate electrodes has a cross section that is arc-shaped.

11. The electronic component according to claim 7, wherein the electronic component element includes a substantially rectangular plate and is supported at both ends thereof in the longitudinal direction by the plurality of substrate electrodes in a point-contact manner, and the following formula is satisfied:

$$Lk-2We<Lp<Lk-We$$

where Lp is the length of the electronic component element in the longitudinal direction thereof, Lk is the length of the case substrate in the longitudinal direction of the electronic component element, and We is the length of the substrate electrode in the longitudinal direction of the electronic component element.

12. The electronic component according to claim 7, wherein each of the substrate electrodes Includes an electrode layer made of a baked conductive paste.

13. The electronic component according to claim 7, wherein the conductive bonding material is a flexible conductive adhesive.

14. The electronic component according to claim 7, wherein the electronic component element is an energy-trap-type piezoelectric resonator.

* * * * *